(12) United States Patent
Zhao et al.

(10) Patent No.: US 6,650,018 B1
(45) Date of Patent: Nov. 18, 2003

(54) HIGH POWER, HIGH LUMINOUS FLUX LIGHT EMITTING DIODE AND METHOD OF MAKING SAME

(75) Inventors: Yongsheng Zhao, Monterey Park, CA (US); William W. So, Walnut, CA (US); Kevin Y. Ma, Arcadia, CA (US); Chyi S. Chern, Arcadia, CA (US); Heng Liu, Arcadia, CA (US); Eugene J. Ruddy, Claremont, CA (US)

(73) Assignee: AXT, Inc., Fremont, CA (US)

( * ) Notice: Subject to any disclaimer, the term of this patent is extended or adjusted under 35 U.S.C. 154(b) by 0 days.

(21) Appl. No.: 10/155,001

(22) Filed: May 24, 2002

(51) Int. Cl.[7] ............................................... H01L 33/00

(52) U.S. Cl. ...................... 257/775; 257/749; 257/99; 257/91; 257/98; 372/50

(58) Field of Search ................................ 257/749, 775, 257/99, 91, 98; 372/50

(56) References Cited

U.S. PATENT DOCUMENTS

| | | | |
|---|---|---|---|
| 5,698,865 A | | 12/1997 | Gerner et al. |
| 5,798,536 A | * | 8/1998 | Tsutsui .......................... 257/99 |
| 6,130,446 A | * | 10/2000 | Takeuchi et al. .............. 257/99 |
| 6,204,512 B1 | * | 3/2001 | Nakamura et al. ............. 257/13 |
| 6,307,218 B1 | | 10/2001 | Steigerwald et al. |

* cited by examiner

*Primary Examiner*—Jerome Jackson
(74) *Attorney, Agent, or Firm*—Jean C. Edwards; Sonnenschein Nath & Rosenthal LLP (57) ABSTRACT

A high power, high luminous flux light emitting diode (LED) comprises a substrate, a light-emitting structure, a first electrode and a second electrode. The LED has a top surface layout design in which the first electrode has a number of legs extending in one direction, and the second electrode has a number of legs extending in the opposite direction. At least portions of the legs of the first electrode are interspersed with and spaced apart from portions of the legs of the second electrode. This provides a configuration that enhances current spreading along the length of the legs of both electrodes.

45 Claims, 10 Drawing Sheets

HIGH POWER, HIGH LUMINOUS FLUX LIGHT EMITTING DIODE AND METHOD OF MAKING SAME

FIELD OF INVENTION

The present invention relates generally to light emitting devices using compound semiconductor materials. More particularly, the present invention relates to high power, high luminous flux light emitting diodes.

BACKGROUND OF INVENTION

Light emitting diode (LED) technology has revolutionized lighting equipment in recent years. Due to the advantages offered by light emitting diodes (LEDs), many applications now incorporate LEDs instead of conventional incandescent lighting sources. These applications include, but are not limited to, traffic signaling, electronic signs, medical applications, instrumentation, and general illumination. LEDs generally consume much less power as equally luminous incandescent lamps, and LEDs are also much more durable than conventional incandescent lighting sources. This leads to less frequent replacements and lower maintenance costs. Also, less electrical power consumption by the LEDs translates into less strain on a power source, such as an alternator or battery. LEDs are also insensitive to vibration and have lower switch-on time in comparison to most incandescent lighting sources.

For LEDs to replace incandescent lighting sources in applications as described above, the LEDs will have to provide high luminous output while maintaining reliability, low power consumption and low manufacturing cost. In many of the above-described applications, the LEDs are in the form of LED chips having an edge length of around 300 $\mu$m. An individual LED chip of this type usually has low power output and can only be subjected to low injection current. As a result, these LED chips need to be assembled into clusters or arrays to achieve the required luminous flux level.

Multiple clusters or arrays of LED chips are generally mounted onto a board and then integrated with a lamp housing, electronics, and various lenses. Due to the small size of these LED chips and the limited amount of luminous flux that each can generate, the number of LED chips necessary to achieved the required flux levels is generally quite large. This increases the complexity in packaging and installing LED chips for a particular application, in terms of both time and manufacturing cost. For example, much time and manufacturing cost are needed for mounting, optical collecting, and focusing the emissions from the LED chips. Extra time and cost are also required to install and aggregate the LED chips in a specific arrangement as required by a specific application.

Attempts have been made to manufacture LED chips that are capable of creating higher luminous flux than the ~300 $\mu$m edge length LED chips. One approach is to increase the edge length and make each LED chip larger. The larger size allows more current to flow over and through the LED chip, and higher luminous flux is generated per LED chip as a result. Although the larger size simplifies packaging and installation of the LED chips because a fewer devices are required to be packaged and installed, reliability and power consumption become problematic. Specifically, larger size LED chips currently available are limited in their power and luminous flux output. For example, several commercial devices currently available are limited to a current dissipation of approximately 350 mA.

The primary limiting factor in larger LED chips is the inability for current to spread evenly over and through the entire structure of an LED chip. Rather, the current accumulates at specific spots on the LED chip, preventing the efficient use of the available lightemitting semi-conductive material. This phenomenon is commonly referred to as "current crowding." Current crowding tends to occur at points on electrical contacts of an LED chip because of the tendency of charge carriers to travel a path of least resistance. Current crowding may also occur in certain regions of the electrical contacts depending on the capacity for each of the regions to accept and spread current. Current crowding leads to unstable luminous flux output with bright spots and dim spots on the LED chip. Current crowding also necessitates more current to be injected into the LED chip, which leads to high power consumption and can cause breakdown in the LED chip. As a result, light is not emitted efficiently, and power consumption is not minimized. Moreover, the larger size LED chips currently available include additional limiting factors that further contribute to its limited power and limited luminous flux output. These limiting factors include ineffective heat dissipation, deficient light enhancing structure, and limited number of light emitting regions that results in high light re-absorption within the device structure. Therefore, high power, high luminous flux LED chips cannot be achieved using conventional means.

SUMMARY OF INVENTION

Aspects of the present invention relate to high power, high luminous flux light emitting diodes and the methods of making them. In one embodiment, the light-emitting diode comprises a substrate, a light-emitting structure disposed above the substrate along a vertical axis, a P electrode having a number of legs extending in one direction along a substantially horizontal axis perpendicular to the vertical axis, and an N electrode having a number of legs extending substantially horizontally in the direction opposite to the direction of the legs of the P electrode. The light-emitting structure includes a P cladding layer, an active layer and an N cladding layer. The P electrode is in contact with the P cladding layer of the light-emitting structure, while the N electrode is in contact with the N cladding layer of the light-emitting structure. The N electrode is disposed at a lower surface than the P electrode, where the lower surface is defined by a mesa etch process, forming a mesa edge separating the N electrode from the P electrode. A thin metal layer is under the P electrode, which is overlapped and in contact with the P electrode and separated from the N electrode by the mesa edge. The P and N electrodes are designed in such a manner that portions of the legs of the P electrode are interspersed with and spaced apart from portions of the legs of the N electrode.

DETAILED DESCRIPTION

Figure 1:
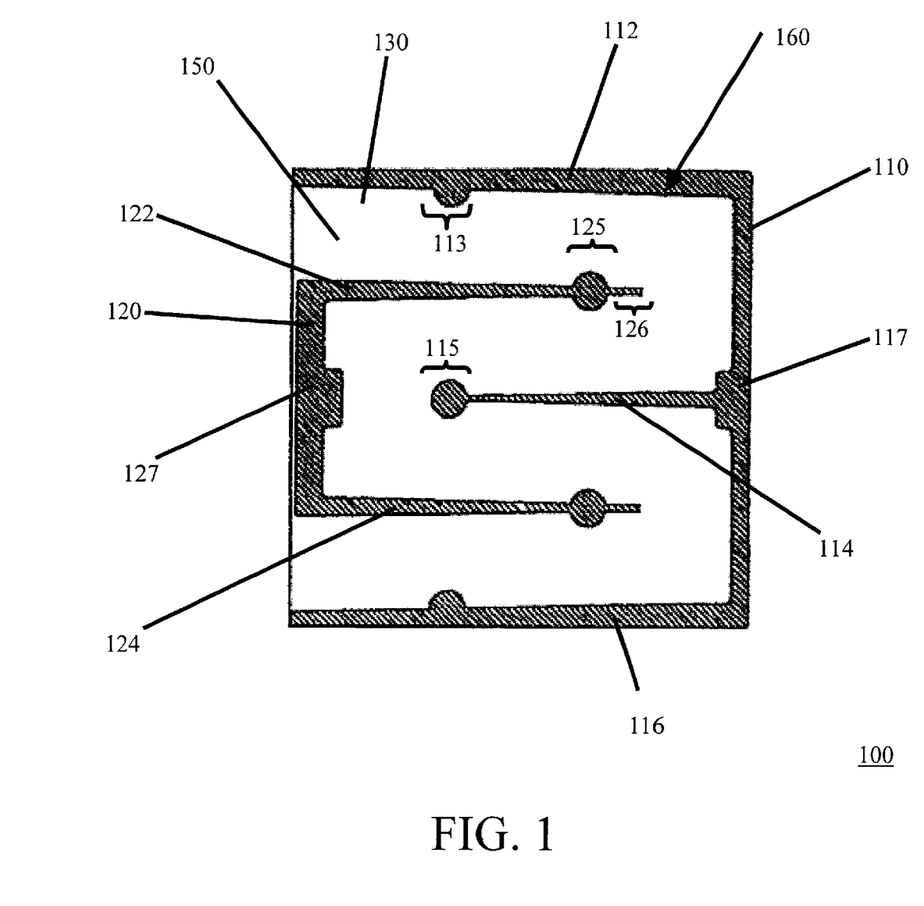
FIG. 1 illustrates a top level view of an LED 100 constructed according to an embodiment of the present invention.

FIG. 1 illustrates a top level view of an LED 100 constructed according to an embodiment of the present invention. The top view of the LED 100 shows an N electrode 110, a P electrode 120, and a region 150 capable of passing light defined by the P electrode 120 and the N electrode 110. A thin, substantially translucent metal layer 130 is disposed above the region 150 and between the N electrode 110 and the P electrode 120, which is overlapped with the P electrode 120, and separate from the N electrode 110 by the mesa edge 160. Although the LED 100 is shown to retain a square shape in the embodiment of FIG. 1, it is noted that any shape may be employed depending on the 'specific application. In one embodiment, the LED 100 is a square and has an edge length of around 1.20 mm~1.26 mm.

Although not shown in FIG. 1, disposed below the thin metal layer 130 and the region 150, along a vertical axis, is a light-emitting structure with an N cladding layer and a P cladding layer. The N electrode 110 is in contact with the N cladding layer at outside of the mesa edge 160, while the P electrode 120 is in contact with the P cladding layer and overlap with the thin metal current spreading layer 130. In operation, a voltage difference is applied between the P electrode 110 and N electrode 120 to activate the light-emitting structure of the LED 100, and current flows from the P electrode 110 to the N electrode 120 and the current spreaded from the P electrode 110 to the thin metal layer 130 diffuses through the layers of the LED 100. The spreading of the current from the P electrode 110 to the N electrode 120 is enhanced by the layout design of and/or specific features on the P and N electrodes 110, 120 as well as the thin metal layer 130. With the current spread and 4 flowing through the active region of the LED, recombination of charge carriers occurs resulting in the release of light energy through the region 150 and out into the environment.

In the embodiment, the N electrode 110 has a contact portion 117 and three substantially straight tapered legs 112, 114, 116 extending to the left along a horizontal axis, and the P electrode has a contact portion 127 and two straight tapered legs 122, 124 extending to the right along the horizontal axis. The two legs 122, 124 of the P electrode 120 are interspersed with and spaced apart from the three legs 112, 114, 116 of the N electrode 110. As viewed from above, the legs 112, 114, 116, 112, 124 appear to be parallel to each other. In this configuration, the leg 122 of the P electrode 120 is disposed between the legs 112, 114 of the N electrode 110, while the leg 124 of the P electrode 120 is disposed between the legs 114, 116 of the N electrode 110. On the other hand, the leg 114 of the N electrode 110 is disposed between the legs 122, 124 of the P electrode. Although the P electrode 120 is shown to have two legs and the N electrode 110 is shown to have three legs, the placement of the P electrode 120 and the N electrode 110 may be interchanged according to embodiment of the present invention. That is, a P electrode would be the right electrode with three legs and a larger total surface area, while an N electrode would be the left electrode with two legs and a smaller total surface area.

One feature of the embodiment in FIG. 1 is the legs of the N and P electrodes 110, 120 being tapered, with wide ends being closer to the electrode contact portions 117, 127 of the N and P electrodes 110, 120, respectively, and narrow ends being further away from the electrode contact portions 117, 127 of the N and P electrodes 110, 120, respectively. In FIG. 1, the legs 122, 124 of the P electrode 120 are tapered to the right, while the legs 112, 114, 116 of the N electrode 110 are tapered to the left. Because the tapering in the legs 112, 114, 116 of the N electrode 110 runs in the opposite direction to the tapering in the legs 122, 124 of the P electrode 120, the legs 122, 124 of the P electrode 120 taper off to the right and decrease in width while the legs 112, 114, 116 of the N electrode 110 expand to the right and increase in width.

In one embodiment, the decrease in width in the P electrode legs 122, 124 along the length of said legs in one direction is proportional to the increase in width in the N electrode legs 112, 114, 116 along the length of said legs in the same direction. Thus, each of the P electrode legs 122, 124 is spaced apart from its neighboring N electrode leg in substantially equal distance along each of the P electrode legs 122, 124 and its neighboring N electrode leg. For example, in looking at the leg 122 of the P electrode 120 and the leg 114 of the N electrode 110, the P electrode leg 122 tapers in direction opposite to that of the N electrode leg 114. This tapering arrangement allows the narrowing of the P electrode leg 122 in one direction to be compensated by the widening of the N electrode leg 114 in the same direction. This makes the distance between the P electrode leg 122 and the N electrode leg 114 substantially equal along the length of the two legs 114, 122, and variations in this distance are minimized. Thus, when current flows from the P electrode leg 122 through the thin film 130 to the N electrode leg 114, the current traverses substantially the same distance along the length of the two legs and, hence a substantially equally resistive path. This promotes a uniform current spreading along the length of the two legs 122, 114 in the rectangular shaped region define by the two legs 122, 114.

The layout design of the P electrode 120 and the N electrode 110 defines the region 150, which substantially retains a M shape according to the embodiment shown in FIG. 1. In this configuration, the M shape is rotated 90° clockwise. The region 150 is capable of passing light produced from the LED 100. The thin metal layer 130 is formed above the region 150 and disposed between the P electrode 120 and the N electrode 110. In one embodiment, the thin metal layer 130 overlaps with the P electrode 120 and separate from the N electrode 110 by the mesa edge 160. The thin metal layer 130 comprises Nickel and Gold (Ni/Au). Alternatively, other material that has current spreading characteristics and does not significantly obstruct light produced from the LED 100 may also be used.

The thin metal layer 130 promotes current spreading therethrough as well as current diffusion down the layers therebelow. Through the thin metal layer 130, current spreads initially from the wide end of the P electrode leg 122 to portions of the region 150 next to the wide end. The wide end provides more area for the initial high current to start spreading, avoiding current crowding near the electrode contact portion 127 and the thin metal layer 130. The current spreads outward to the portion of the region 150 next to the electrode leg 122 as the current propagates toward the narrow end of the P electrode leg 122. Because less and less current is present as the current spreads to the region 150 along the P electrode leg 122 and propagates toward the narrow end, the P electrode leg 122 is made narrower. As the taper progresses along an electrode leg, resistance in the conductor increases, and less current passes. Consequently, current escapes from the electrode into the conductive layer substantially evenly along the edge of the electrode rather than from one point. This again has the advantage of promoting even current spreading along the length of the legs of the P and N electrodes. Similarly, the P electrode leg 122 and the N electrode leg 112 function in likewise fashion as described above for the P electrode leg 122 and the N electrode leg 114. An added benefit of making the legs tapered is to enlarge the region 150, creating extra area for light to emit from the LED 100. This further improves luminous efficiency.

In one embodiment, the leg 114 of the N electrode 110 includes an enlarged portion 115 at its end, while the outer leg 112 of the N electrode 110 includes an enlarged portion 113 toward the end of the outer leg 112. Similarly, the leg 122 of the P electrode also includes an enlarged portion 125 and an extension 126 toward the end of the leg 122. In one embodiment, the enlarged portions 113, 115, 125 encourage current distribution along the length of their respective legs and toward the legs' respective narrow ends. This again promotes current spreading and avoids current crowding in the LED 100. In another embodiment, the enlarged portions 113, 115, 125 and/or the extension 126 provide better anchoring of their respective legs by increasing the contact area between the legs and the layer below. This promotes to decrease the contact resistance and increase reliability of the device. Although the enlarged portions 113, 115, 125 are shown to have either a semicircular or circular shape, it is noted that the enlarged portions 113, 115, 125 may have another shape, such as a square, rectangular, triangular and elliptical shape. In other embodiments, different sizes and different shapes of the enlarged portions may also be employed in a single LED or among different LEDS in multiple arrays of LEDs.

Figure 2:
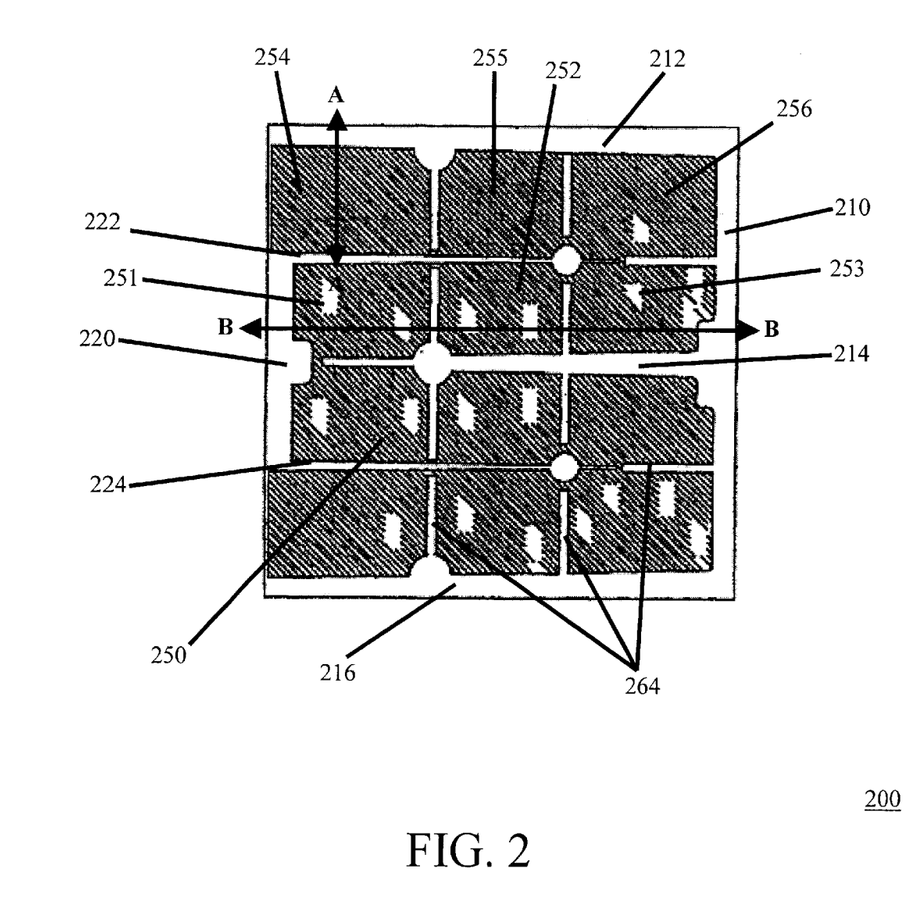
FIG. 2 illustrates a top level view of an LED 200 constructed according to an embodiment of the present invention.

FIG. 2 illustrates a top level view of an LED 200 constructed according to another embodiment of the present invention. The LED 200 has substantially the same structure as that of the LED 100. The top view of the LED 200 shows an N electrode 210, a P electrode 220, a region 250 capable of passing light defined by the P electrode 220 and the N electrode 210, and a plurality of channels 264 disposed in the region 250. The N electrode 210 has three straight tapered legs 212, 214, 216 extending to the left, and the P electrode 220 has two straight tapered legs 222, 224 extending to the right. For illustration purpose only, the region 250 is shown in black, while the P and N electrodes 220, 210 and the channels 264 are shown in white. The two legs 222, 224 of the P electrode 220 are interspersed with and spaced apart from the three legs 212, 214, 216 of the N electrode 210.

The region 250 substantially retains an M shape, rotated 90° clockwise, according to the embodiment shown in FIG. 2. The region 250 is capable of passing light produced from a light-emitting structure disposed below the surface of the LED 200. Disposed within the region 250 are a number of channels 264 that further divide the region 250 into sub-regions. For examples, with respect to the top portion of the region 250 defined by the P electrode legs 212, 214 and the N electrode leg 222, the channels 264 divide this portion into six substantially rectangular shaped sub-regions 251–256. In other embodiments, different shapes may be employed for the sub-regions. The channels 264 are openings or trenches within the region 250, and they provide additional surface area to the region 250 for light to escape. The channels 264 do not have absorption materials above them to limit light output from the light-emitting structure. Examples of the absorption materials include the thin metal layer 230 and the light emitting structure and P and N electrodes. Thus, light emits from the channels 264 in a more efficient manner. This improves luminous efficiency of the LED 200. The channels 264 further minimize contacts between the sub-regions themselves, allowing current spreading to be focused within a sub-region, between a respective portion of a leg of the P electrode 220 and a respective portion of a leg of the N electrode 210 of the sub-region.

In the exemplary configuration shown in FIG. 2, current spreads from the P electrode leg 222 out toward the sub-regions 251–256 to either the N electrode leg 212 or the N electrode leg 214. The tapering of the P electrode legs 222, 224 along the length of those legs run opposite to the tapering of the N electrode legs 212, 214, 216 along the length of the N electrode legs 212, 214, 216. The sub-regions 251, 254 are near the wide end of the P electrode leg 222, while the sub-region 253 is near the wide end of the N electrode leg 214, and the sub-region 256 is near the wide end of the N electrode leg 212. As the current comes in from the wide end of the P electrode leg 222, the current starts spreading into the region closest to the wide end, i.e., sub-regions 251, 254, and moving toward to the narrow ends of the N electrode legs 212, 214. The current propagates along the length of the P electrode leg 222, and then current spreading occurs in sub-regions 252, 255. In the same manner, current spreading occurs in sub-regions 253, 256 when current propagates to the narrow end of the P electrode leg 222.

Although not readily shown from the top view of the LED 200, the channels may have vertical walls or angled walls according to different embodiments of the present invention. Although the channels 264 are shown to be straight and either horizontal or vertical when viewed from above in FIG. 2, it is noted that channels may retain a different line shape or may be slanted or curved when viewed from above in other embodiments. The number of channels may also vary, dividing the region 250 into more or fewer than the twelve sub-regions shown in FIG. 2. Channels with different lengths and widths may also be employed in a single LED or among different LEDS in multiple arrays of LEDs according to other embodiments.

Figure 3:
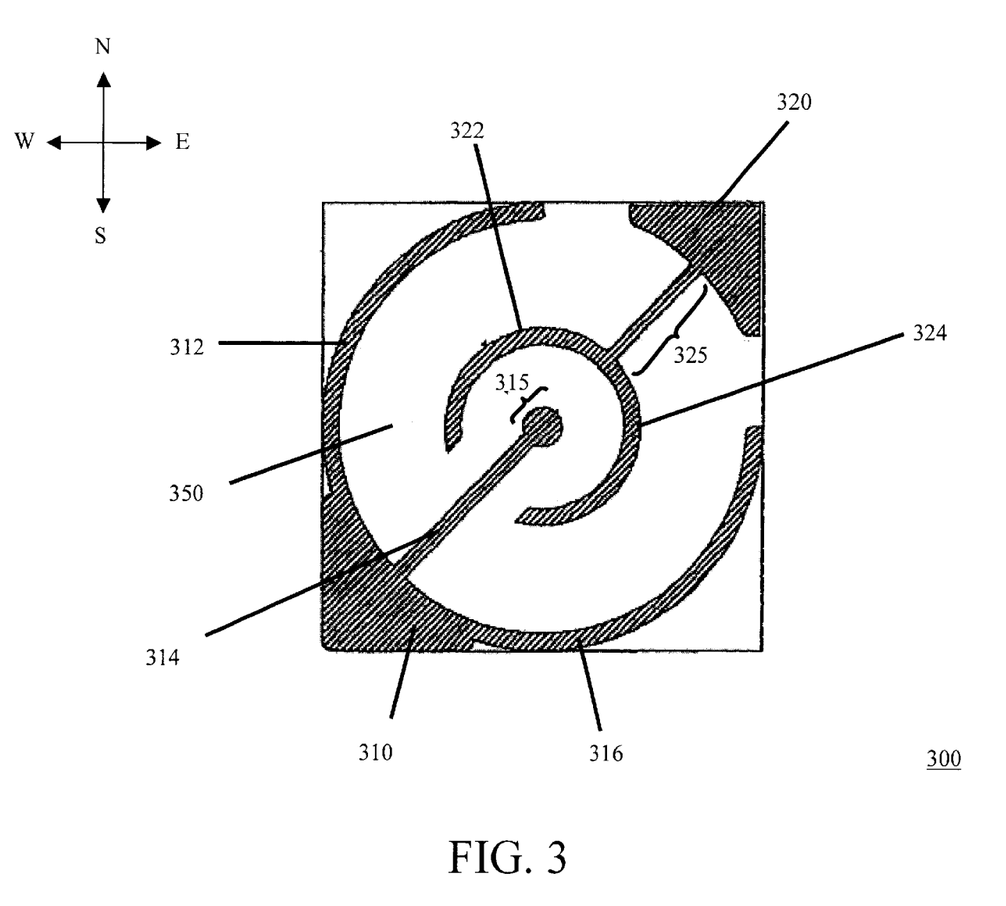
FIG. 3 illustrates a top level view of an LED 300 constructed according to an embodiment of the present invention.

FIG. 3 illustrates a top level view of an LED 300 constructed according to an embodiment of the present invention. The LED 300 has an electrode design of the N and P electrodes that is different from those illustrated in FIGS. 1 and 2. In the embodiment, some of the legs of or portions of the legs of the LED 300 are curved, creating a region 350 with rounded portions shown in FIG. 3. The top view of the LED 300 shows an N electrode 310, a P electrode 320, and the region 350 capable of passing light defined by the P electrode 320 and the N electrode 310. The N electrode 310 has a straight leg 314 and two curved legs 312, 316 extending to the northeast corner, and the P electrode 320 has two curved segments 322, 324 extending to the southwest corner. In particular, the P electrode 320 includes a straight arm 325 that branches into the curved segments 322, 324. For illustration purpose only, the region 350 is shown in white, while the P and N electrodes 320, 310 are shown in black. The two segments 322, 324 of the P electrode 320 are interspersed with and spaced apart from the three legs 312, 314, 316 of the N electrode 310.

In the embodiment, the leg 314 of the N electrode 310 includes an enlarged portion 315 at its end, which has similar characteristics as the enlarged portion 115 shown in FIG. 1. Although the enlarged portion 315 is shown to have a circular shape, it is noted that another shape may be employed in other embodiments. Although the legs/segments of the P and N electrodes 320, 310 are not tapered and channels are not provided in the LED 300, legs/segments of an LED with a similar electrode design as that of the LED 300 may be tapered and/or channels may be provided according to other embodiments of the present invention.

Figure 4:
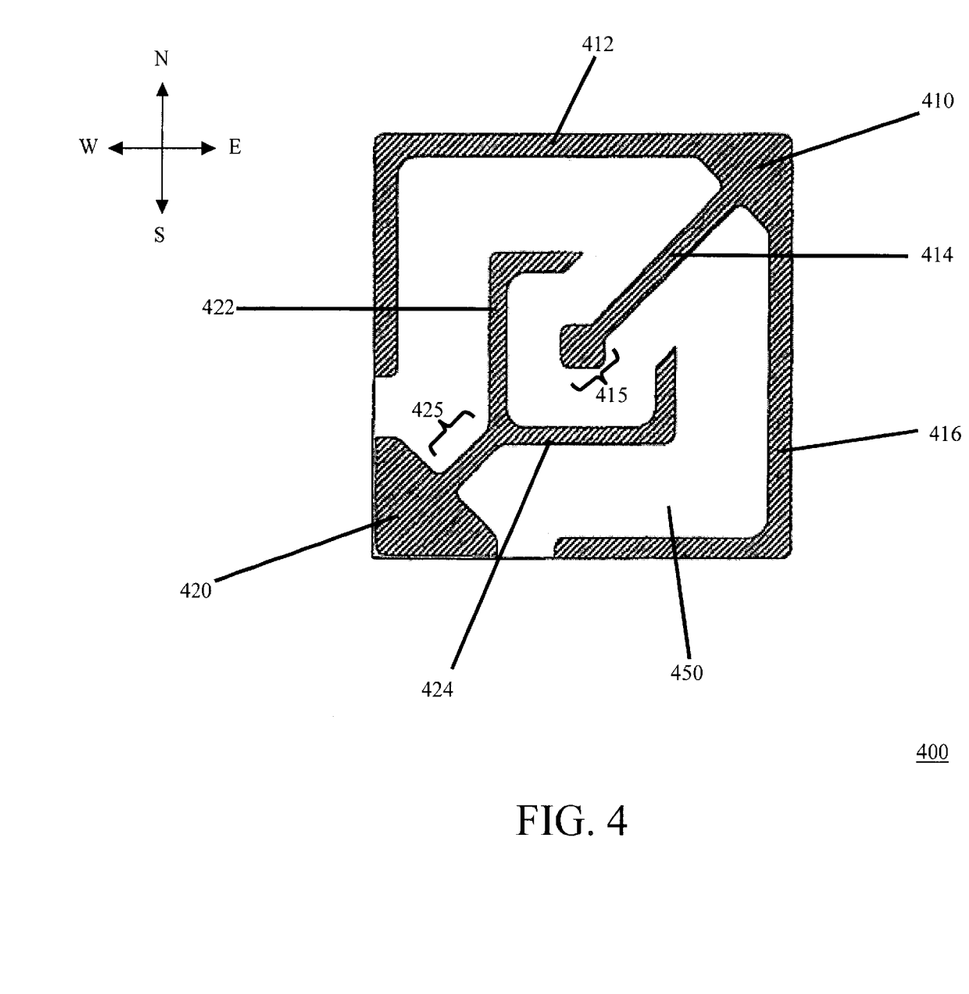
FIG. 4 illustrates a top level view of an LED 400 constructed according to an embodiment of the present invention.

FIG. 4 illustrates a top level view of an LED 400 constructed according to an embodiment of the present invention. The LED 400 presents yet another electrode design of the N and P electrodes. In the embodiment, some of the legs or portions of the legs of the LED 400 are angled, creating a region 450 with triangular portions shown in FIG. 4. The top view of the LED 400 shows an N electrode 410, a P electrode 420, and the region 450 capable of passing light defined by the P electrode 420 and the N electrode 410. The N electrode 410 has a straight leg 414 and two angled legs 412, 416 extending to the southwest corner, and the P electrode 420 has two angled segments 422, 424 extending to the northeast corner. In particular, the P electrode 420 includes a straight arm 425 that branches into the angled segments 422, 424. For illustration purpose only, the region 450 is shown in white, while the P and N electrodes 420, 410 are shown in black. The two segments 422, 424 of the P electrode 420 interspersed with and spaced apart from the three legs 412, 414, 416 of the N electrode 410.

In the embodiment, the leg 414 of the N electrode 410 includes an enlarged portion 415 at its end, which has similar characteristics as the enlarged portion 115 shown in FIG. 1. Although the enlarged portion 415 is shown to have a square shape, it is noted that another shape may be employed in other embodiments. Although the legs/segments of the P and N electrodes 420, 410 are not tapered and channels are not provided in the LED 400, legs/segments of an LED with a similar electrode design as that of the LED 400 may be tapered and/or channels may be provided according to other embodiments of the present invention.

Figure 5:
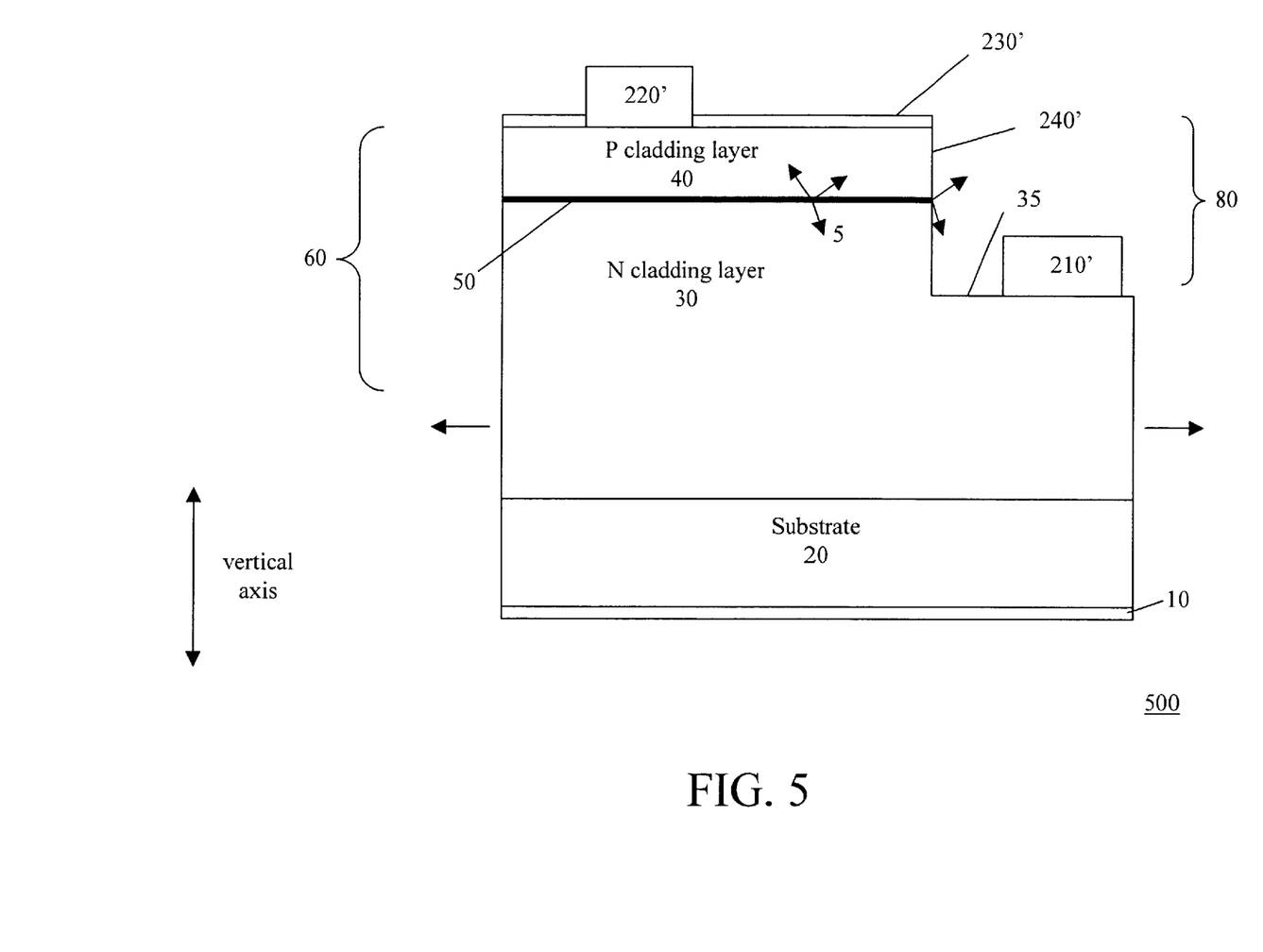
FIG. 5 shows a cross-sectional side view of an LED 500 constructed according to an embodiment of the present invention.

FIG. 5 shows a cross-sectional side view of an LED 500 constructed according to an embodiment of the present invention. If the LED 500 were to represent the LED 200 shown in FIG. 2 or an embodiment similar to the LED 200 when looking from above, this cross-sectional side view would represent a view obtained by cutting across Line A—A shown in FIG. 2. The cross-sectional side view of the LED 500 shows a substrate 20, a reflective layer 10, a light-emitting structure 60, a well 80, a thin metal layer 230', a P electrode 220' and an N electrode 210'. In one embodiment, the LED 500 is Gallium Nitride (GaN) based, and the substrate 20 is made of sapphire, silicon carbide, or another suitable crystalline material. The reflective layer 10 is disposed below the substrate 20 along a vertical axis. The reflective layer 10 reflects light back toward the top surface, or the emitting surface, of the LED 500. In one embodiment, the reflective layer 10 acts as a mirror and is made of aluminum. In other embodiments, other types of metal or material that provides the similar reflective effect may be utilized. According to an embodiment of the present invention, the reflective layer 10 is made of material that further provides thermal benefit to the LED 500 by improving the heat dissipation capability of the LED 500. In the embodiment, the reflective layer 10 tends to draw heat produced in the LED 500 during operation and radiate it into the surrounding environment in an efficient manner.

The light-emitting structure 60 is disposed above the substrate 20. In one embodiment, the light-emitting structure 60 comprises an active layer 50 sandwiched in between an N cladding layer 30 and a P cladding layer 40. In operation, the forward biasing of the LED 500 causes light 5 to be emitted from the active layer 50. Light emits in various directions as shown by the arrows in FIG. 5. Light that travels toward the substrate 20 will be reflected back by the reflective substrate 10. Within the light-emitting structure 60, the N cladding layer 30 is disposed above the substrate 20 along the vertical axis, and the P cladding layer 40 is disposed above the N cladding layer 30 along the vertical axis. In one embodiment, the P cladding layer 40 comprises Aluminum Gallium Nitrite (AlGaN), and the N cladding layer 30 comprises silicon doped Gallium Nitrite (Si:GaN). The P cladding layer 40 and the N cladding layer 30 form parts of the light-emitting structure of the LED 500. The thin metal layer 230' is disposed above the P cladding layer 40 of the light-emitting structure along the vertical axis and in contact with the P cladding layer 40. Although the P cladding layer 40 is shown to be on top of the N cladding layer 30 in LED 500, their positions may be reversed in other embodiments.

In the embodiment shown in FIG. 5, the P electrode 220' is disposed above the P cladding layer 40 of the light-emitting structure along the vertical axis. Being in contact with the P cladding layer 40 at one end, the P electrode 220' extends through the thin metal layer 230' along the vertical axis at the other end. On the other hand, the N electrode 210' is disposed in the well 80 that has an exposed surface 35 of the N cladding layer 30. The N electrode 210' is in contact with the surface 35 of the N cladding layer 30 in the well 80. Because the N electrode 210' is disposed in the well 80, which is at a lower elevation than the top of the LED 500, the N electrode 210' is at a lower elevation than the P electrode 220'. In another embodiment, the location of the P cladding layer 40 and the P electrode 220' may be switched with that of the N cladding layer 30 and the N electrode 210', respectively, making the N electrode 210' be at a higher elevation than the P electrode 220'. In yet another embodiment, the well 80 is not present, and there is no elevation offset between the P electrode 220' and the N electrode 210'.

In one embodiment, the LED 500 may further include other layers disposed above and/or below the light-emitting structure 60. These layers, along with the layers shown presently in FIG. 5, may be grown in a Metal Organic Chemical Vapor Deposition (MOCVD) reactor. A buffer layer(s) may, for example, be inserted somewhere between the substrate 20 and the light-emitting structure 60 to compensate the crystal lattice mismatch between layers and/or to allow formation of high quality materials at the beginning of crystal growth of the LED 500. In one embodiment, a window structure formed of layers of GaN doped with different concentration of Magnesium may be formed between the light-emitting structure 60 and the P electrode 220'. In this case, even though the P electrode 220' is not in direct contact with the P cladding layer 40, they are still electrically connected with each other. The precise structure, composition and doping of the additional layers, as well as the layers presently shown in FIG. 5, are dependent on the required wavelength of the light-emission to be generated and need to be appropriately adapted in each individual case.

Figure 6:
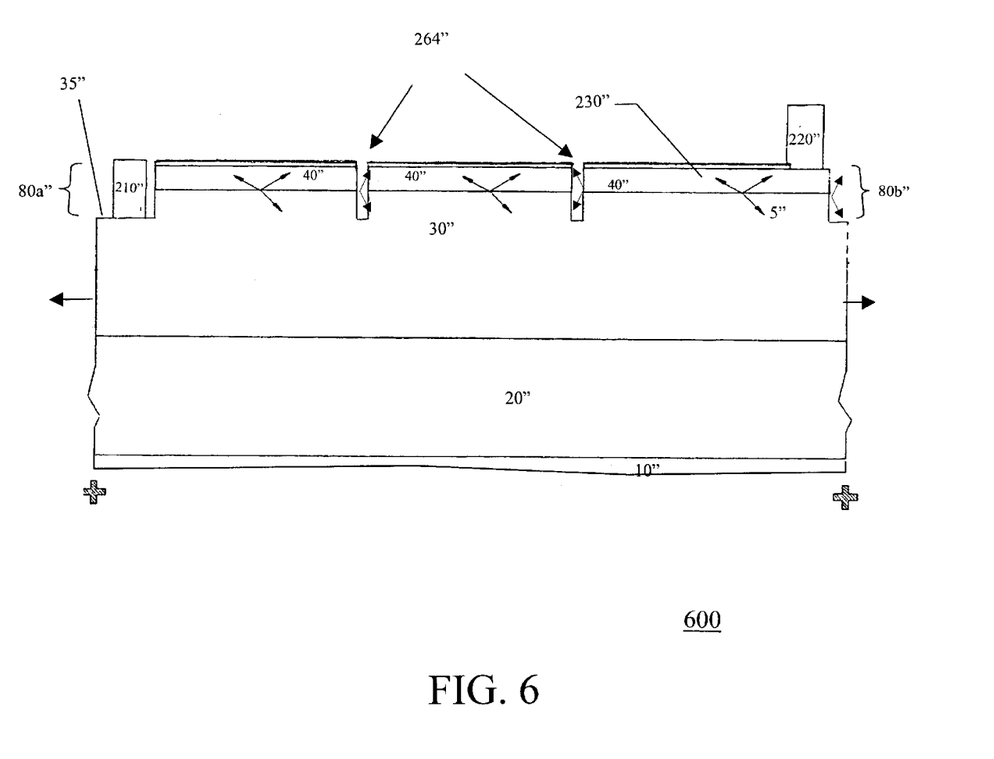
FIG. 6 shows a cross-sectional side view of an LED 600, showing channels, constructed according to an embodiment of the present invention.

FIG. 6 shows a cross-sectional side view of an LED 600 constructed according to an embodiment of the present invention. In particular, channels 264" are illustrated in this cross-sectional side view. If the LED 600 were to represent the LED 200 shown in FIG. 2 or an embodiment similar to the LED 200 when looking from above, this cross-sectional side view would represent a view obtained by cutting across Line B—B shown in FIG. 2. The cross-sectional side view of the LED 600 shows a substrate 20", a reflective layer 10", an N cladding layer 30", a P cladding layer 40", a mesa 80", channels 264", a thin metal layer 230", a P electrode 220" and an N electrode 210". In the embodiment, the reflective layer 10" is disposed below the substrate 20" along a vertical axis. The reflective layer 10" reflects light back toward the top surface, or the side emitting surface, of the LED 600. The N cladding layer 30" is disposed above the substrate 20", and the P cladding layer 40" is disposed above the N cladding layer 30". In operation, the forward biasing of the LED 600 causes light 5" to be emitted therefrom. In one embodiment, the P cladding layer 40" comprises AlGaN, and the N cladding layer 30" comprises InGaN. The thin metal layer 230" is disposed above the P cladding layer 40" along the vertical axis and in contact with the P cladding layer 40". Although the P cladding layer 40" is shown to be on top of the N cladding layer 30" in LED 600, their positions may be reversed in other embodiments.

In the embodiment shown in FIG. 6, the P electrode 220" is disposed above the P cladding layer 40" of the light-emitting structure along the vertical axis. Being in contact with the P cladding layer 40" at one end, the P electrode 220" extends through the thin metal layer 230" along the vertical axis at the other end. On the other hand, the N electrode 210" is disposed in the outside of mesa 80a" that has an exposed surface 35" of the N cladding layer 30". The N electrode 210" is in contact with the surface 35" of the N cladding layer 30" in the outside of mesa 80a", which is at a lower elevation than the top of the LED 600, the N electrode 210" is at a lower elevation than the P electrode 220". In the embodiment, a well 80"b is also provided next to the P electrode 220", providing extra opening to the side of the LED 600.

In one embodiment, the channels 264" cut through the thin metal layer 230" and the P cladding layer 40" to the N cladding layer 30", wherein a small portion of the N cladding layer 40" is also removed. The channels 264" may, for example, have the same depth as that of the wells 80a", 80b". This allows the channels 264" and the wells 80a", 80b" to be formed together simultaneously in the same processing steps. The channels 264", which shape similar to trenches, are openings that provide additional surface area for light to emit from the LED 600. As compare to light that exits from the top surface of the LED 600, which must past through the P cladding layer 40" and the thin metal layer 230", light that exits from the channels 264" does not have to pass through such absorbtion material. The wells 80a", 80b" also provide non-absorbing area for light to exit. The wells 80a", 80b" allow light to exit from the side, without having to pass through the P cladding layer 40" or the thin metal layer 230" and the active layer. Together, the channels 264" and the wells 80a", 80b" further improve luminous efficiency of the LED 600.

Figure 7A:
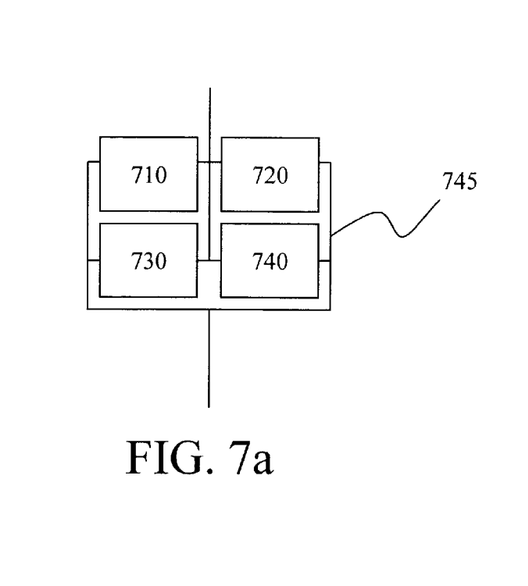
FIGS. 7a and 7b illustrate a plurality of LEDs arranged in exemplary relationships according to embodiments of the present invention.
Figure 7B:
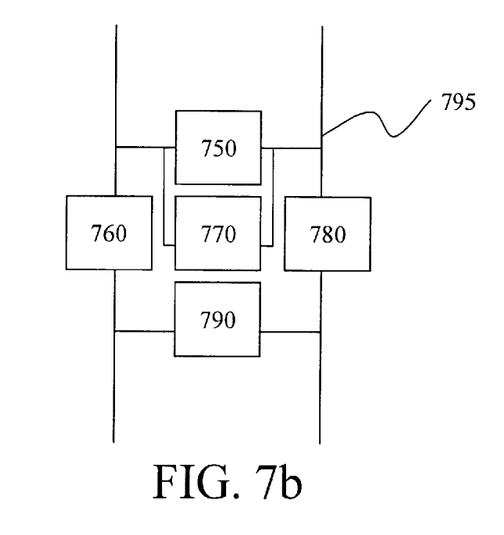

FIGS. 7a and 7b illustrate a number of LED chips arranged in exemplary relationships according to embodiments of the present invention. In these embodiments, a number of LED chips are assembled into multiple clusters or arrays, which are then mounted onto a board and then integrated with a lamp housing, electronics, and/or various lenses to form a product. The LED chips may be placed in various arrangements, and FIGS. 7a and 7b show two examples of such arrangements. In FIG. 7a, the LED chips 710–740 are placed edge to edge, essentially forming a bigger square/rectangle. The wiring 745 provides the required electrical connection for the LED chips 710–745. In FIG. 7b, the LED chips 750–790 are placed substantially in a cross arrangement. The wiring 795 provides the required electrical connection for the LED chips 750–795. The arrangement of the LED chips is dependent on, for example, the required light-emission to be generated or the shape of the housing, and it is appropriately adapted according to individual cases.

Figure 8:
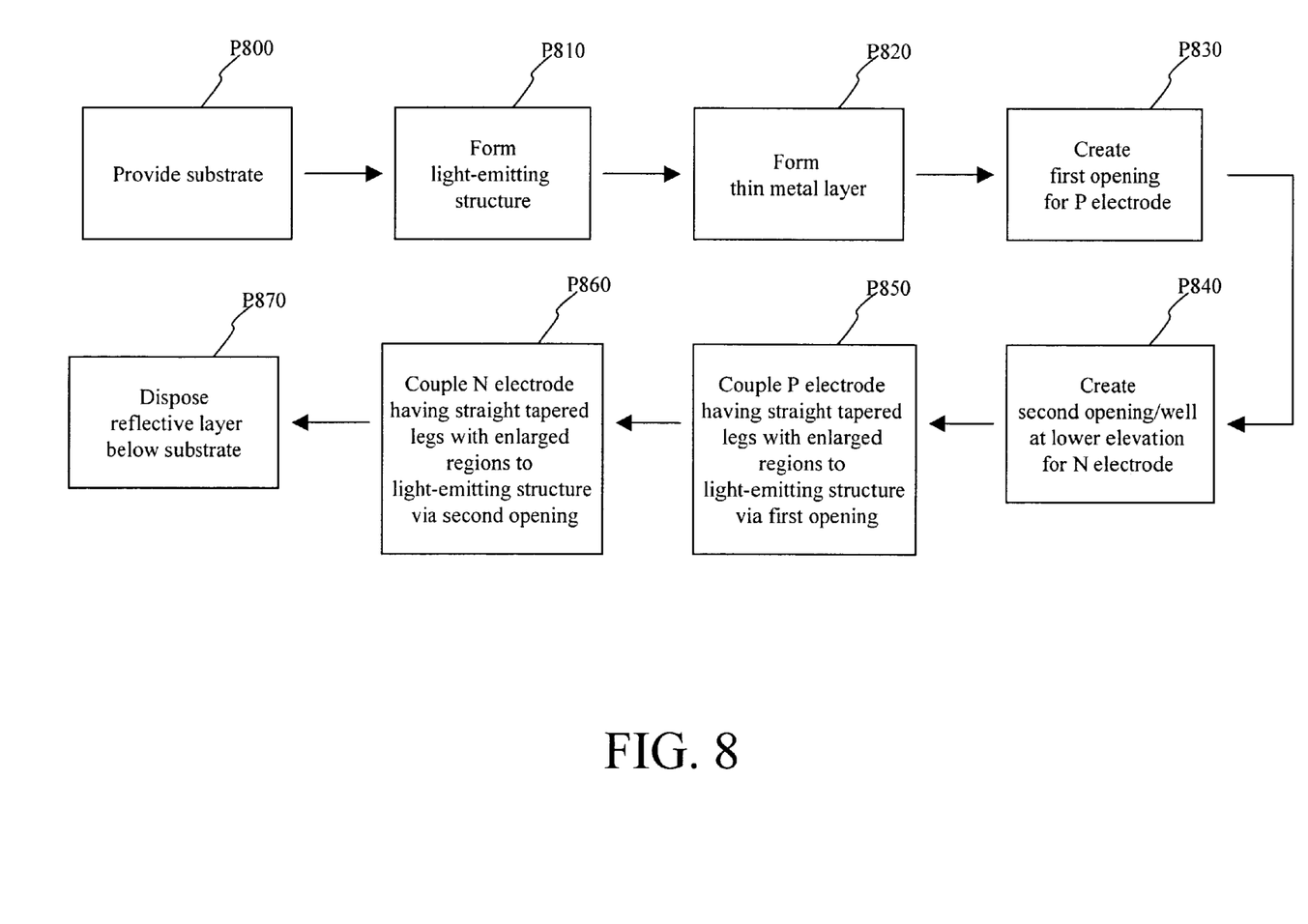
FIG. 8 illustrates a method of making the LED shown in FIG. 1 according to an embodiment of the present invention.

FIG. 8 illustrates a method of making the LED 100 shown in FIG. 1 according to an embodiment of the present invention. In step P800, a substrate is provided. In one embodiment, the substrate comprises sapphire. In block P810, a light-emitting structure is formed above the substrate. This includes the formation of a first cladding layer and a second cladding layer, preferably an N cladding layer and a P cladding layer, respectively. In one embodiment, the P cladding layer is formed above the N cladding layer. In block P820, a thin metal layer is formed above the light-emitting structure and coupled to the light-emitting structure.

In block P830, an opening is created in the thin metal layer, exposing a portion of the first cladding layer of the light-emitting structure. In one embodiment, viewed from above, the opening resembles the U shape of the P electrode shown in FIG. 1, with two straight tapered opening portions extending to the right and having enlarged regions toward the ends of the portions. In the embodiment, the opening is created by conventional masking and etching techniques. In block P840, another opening, in the form of a well when viewed from the side of the LED 100, is created. The well exposes a portion of the second cladding layer of the light-emitting structure. The surface of the well is at a lower elevation than the surface of the opening formed in block P830. In one embodiment, viewed from above, the well resembles the M shape of the N electrode shown in FIG. 1, with three straight tapered opening portions extending to the left and having enlarged regions toward the ends of the portions. In the embodiment, the opening/well is created by conventional masking and etching techniques. In block P850, a P electrode is coupled to the first cladding layer via the opening etched in block P830 and overlap with the thin metal layer at connection area. In block P860, an N electrode is coupled to the second cladding layer via the opening, or the well, etched in block P840.

In block P870, a reflective layer is disposed below the substrate. The reflective layer reflects light back toward the top surface, or the emitting surface, of the LED 100. In one embodiment, the reflective layer is also made of material that further provides thermal benefit to the LED 100 by improving the heat dissipation capability of the LED 100.

Figure 9:
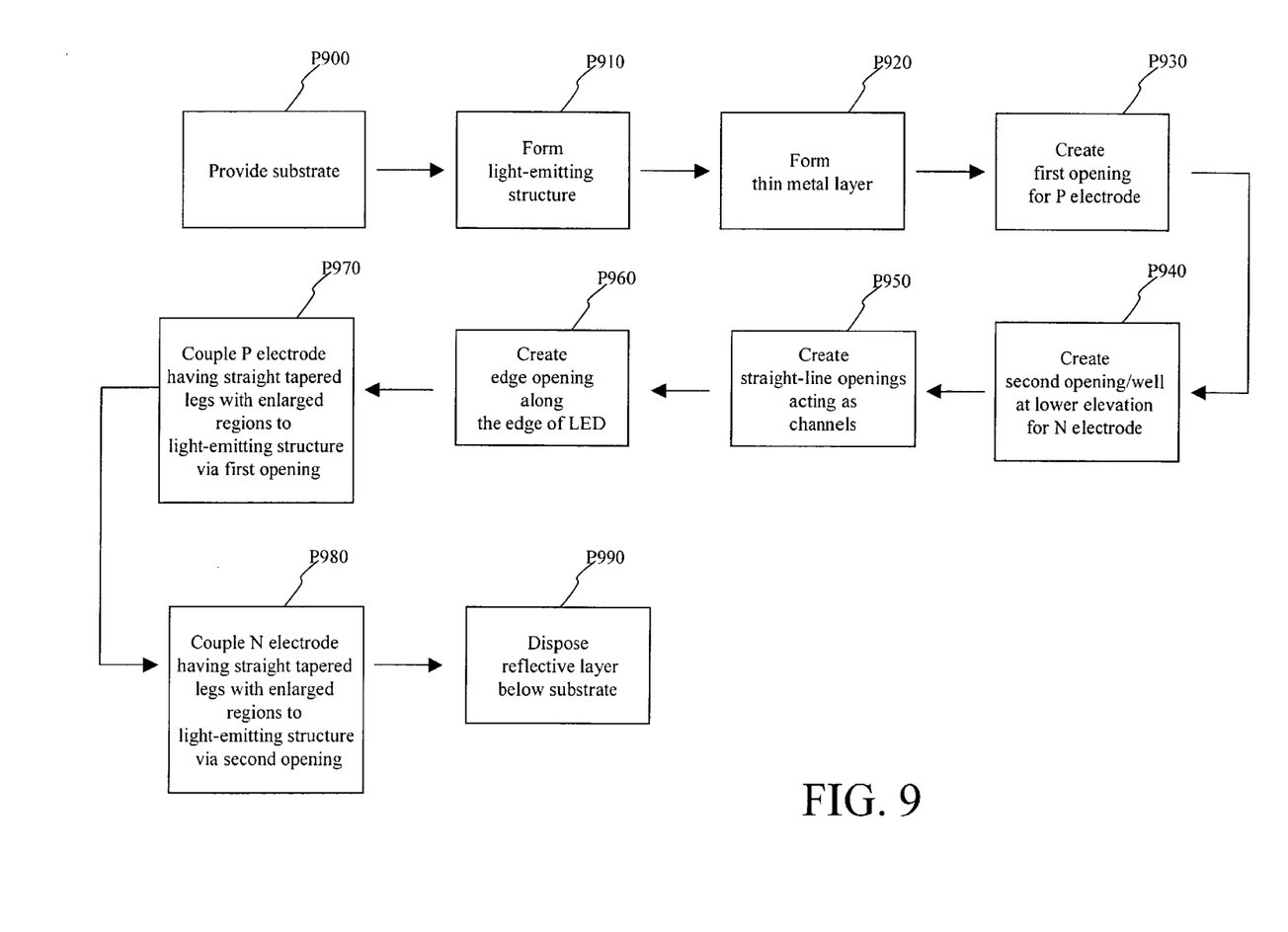
FIG. 9 illustrates a method of making the LED shown in FIG. 2 according to an embodiment of the present invention.

FIG. 9 illustrates a method of making the LED 200 shown in FIG. 2 according to an embodiment of the present invention. In step P900, a substrate is provided. In block P910, a light-emitting structure is formed above the substrate, including the formation of a P cladding layer, an active layer, and an N cladding layer. In block P920, a thin metal layer is formed above the light-emitting structure and coupled to the light-emitting structure. In block P930, a first opening is created in the thin metal layer, exposing a portion of the P cladding layer. In one embodiment, viewed from above, the opening resembles the U shape of the P electrode shown in FIG. 2, with two straight tapered opening portions extending to the right and having enlarged regions toward the ends of the portions.

In block P940, a second opening, in the form of a well when viewed from the side of the LED 200, is created. The second opening exposes a portion of the N cladding layer of the light-emitting structure. The surface of the well is at a lower elevation than the surface of the opening formed in block P930. In one embodiment, viewed from above, the well resembles the M shape of the N electrode shown in FIG. 1, with three straight tapered opening portions extending to the left and having enlarged regions toward the ends of the portions.

In block P950, a number of straight-line openings, each in the form of a well when viewed from the side of the LED 200, are created. In one embodiment, the straight-line openings expose a portion of the N cladding layer of the light-emitting structure. The straight-line openings, which may be vertical or horizontal when viewed from above, serve as the channels of LED 200, dividing the region defined by the P electrode and the N electrode into sub-regions. The top surface of the straight-line openings is at a lower elevation than the surface of the opening formed in block P930.

In block P960, an edge opening is formed along the edge of the LED 200. The fourth opening also represents a well when viewed from the side of the LED 200. Viewed from above, the edge opening resembles a hollow square. The top surface of the edge opening is at a lower elevation than the surface of the opening formed in block P930. In one embodiment, the openings formed in blocks P950 and P960 have the same depth as the one formed in block P940, allowing the three openings formed in blocks P940–P960 to be formed simultaneously during the same etching processes.

In block P970, a P electrode is coupled to the first cladding layer via the first opening etched in P930. In block P980, an N electrode is coupled to the second cladding layer via the second opening, or the well, etched in P940. The third opening is left unchanged. In block P990, a reflective layer is disposed below the substrate to reflect light travels toward it back toward the top surface, or the emitting surface, of the LED 200.

Figure 10:
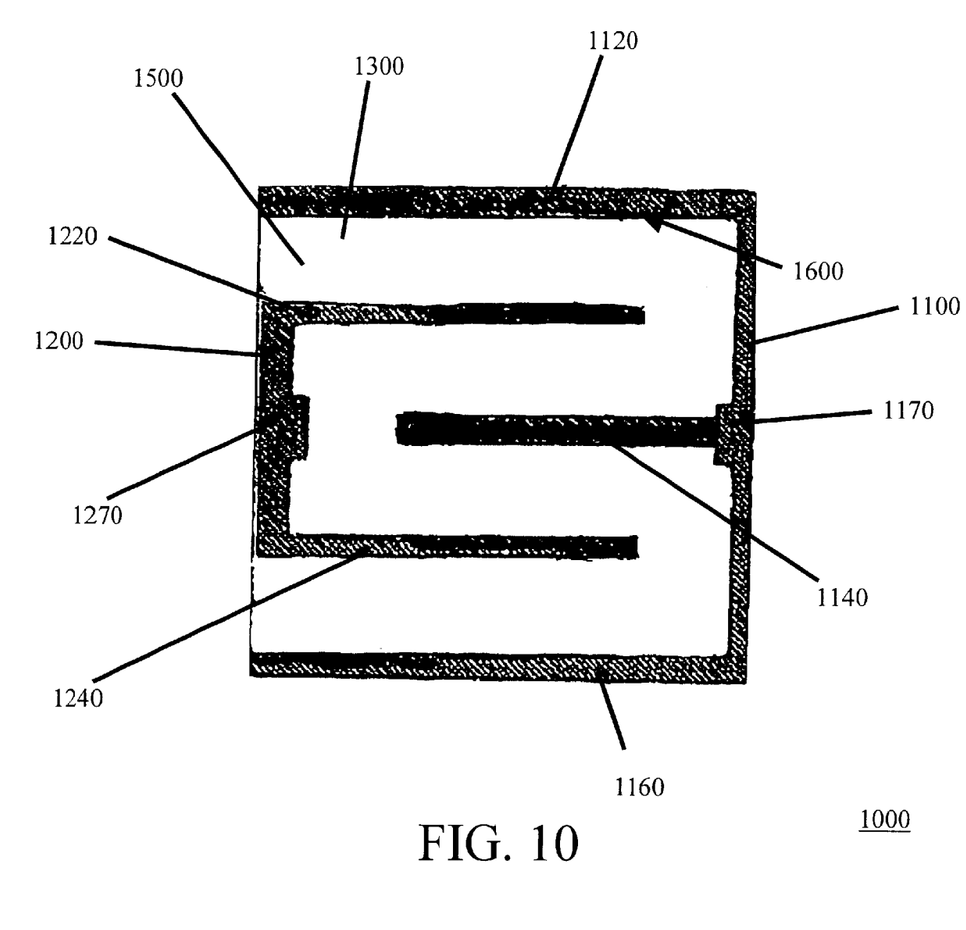
FIG. 10 illustrates a top level view of an LED 1000 constructed according to an embodiment of the present invention.

FIG. 10 illustrates a top level view of an LED 1000 constructed according to an embodiment of the present invention. The top view of the LED 1000 shows an N electrode 1100, a P electrode 1200, and a region 1500 capable of passing light defined by the P electrode 1200 and the N electrode 1100. A thin, substantially translucent metal layer 1300 is disposed above the region 1500 and between the N electrode 1100 and the P electrode 1200, which is overlapped with the P electrode 1200, and separate from the N electrode 1100 by a mesa edge 1600. Although the LED 1000 is shown to retain a square shape in the embodiment of FIG. 10, it is noted that any shape may be employed depending on the specific application.

Although not shown in FIG. 10, disposed below the thin metal layer 1300 and the region 1500, along a vertical axis, is a light-emitting structure with an N cladding layer and a P cladding layer. The N electrode 1100 is in contact with the N cladding layer, while the P electrode 1200 is in contact with the P cladding layer and overlaps with the thin metal current spreading layer 1300. The operation of the LED 1000 has been disclosed hereinabove with respect to similar embodiments and as such shall not be discussed further herein.

The spreading of the current from the P electrode 1100 to the N electrode 1200 is enhanced by the layout design and relative positioning of the P and N electrodes 1100, 1200 as well as the thin metal layer 1300.

In the embodiment depicted in FIG. 10, the N electrode 1100 has a contact portion 1170 and a plurality of legs 1120, 1140, 1160 extending from the contact portion 1170 along a horizontal axis. The P electrode 1200 has a contact portion 1270 and at least two legs 1220, 1240 extending from the contact portion 1270 along the horizontal axis in a direction opposite the plurality of legs 1120, 1140, 1160.

The at least two legs 1220, 1240 of the P electrode 1200 are interdigitated with and spaced apart from the three legs 1120, 1140, 1160 of the N electrode 1100. As viewed from above, the legs 1120, 1140, 1160, 1120, 1240 appear to be parallel to each other. The P electrode 1200 and N electrode 1100 may be interchanged and the current flow reversed and the LED 1000 will still function.

Each leg 1120, 1140, 1160, 1220, 1240 has an outer edge as defined by the periphery thereof. As depicted in FIG. 10, the minimum distance from the outer edge of any one leg of the N electrode 1100 to the outer edge of at least one leg of the P electrode 1200 is substantially the same for all points along the outer edge of each leg 1120, 1140, 1160, 1220, 1240. External edges 1180 of the N electrode legs 1120, 1140, 1160 that are at the periphery of the LED 1000 are not considered in determining the minimum travel distances.

By maintaining the same minimum distance between the outer edges of the N and P electrode legs respectively, current crowding due to differences in resistive distance is minimized and potentially eliminated.

Additionally, the spread of current flow through the active region may be maximized by ensuring that there exists a one to one correspondence between a point on the outer edge of each leg 1120, 1140, 1160 of the N electrode 1100, and the outer edge of each leg 1220, 1240 of the P electrode 1200, such that current will flow through the entire region 1500.

With the electrode designs of the present invention and specific characteristics, the optical output efficiency or the luminous efficiency is improved. The LEDs are also able to operate reliably at its current level while minimizing current crowding. The specific structures of the elements on the LEDs also allow emission of light from a number of additional places within the LEDs. With the reflective layer, the LEDs are also able to have increased illumination and improved heat dissipation capability. Embodiments of the present invention are suitable for implementation in, for example, a large area GaN LED with dimensions of 0.5 mm×0.5 mm to 5 mm×5 mm. Embodiments of the present invention are also suitable for implementation in applications such as those related to traffic lights, electronic signs, high power displays, medicine and dentistry.

It should be emphasized that the above-described embodiments of the invention are merely possible examples of implementations set forth for a clear understanding of the principles of the invention. They are not intended to be exhaustive or to limit the invention to the precise forms disclosed. Variations and modifications may be made to the above-described embodiments of the invention without departing from the spirit and principles of the invention. All such modifications and variations are intended to be included herein within the scope of the invention and protected by the following claims.

What is claimed is:

1. A light-emitting diode comprising:
   a substrate;
   a light-emitting structure disposed above the substrate along a vertical axis, the light-emitting structure including a first cladding layer and a second cladding layer;

a first electrode in contact with the first cladding layer of the light-emitting structure, the first electrode having a projection extending in a first direction along a horizontal axis perpendicular to the vertical axis; and a second electrode in contact with the second cladding layer of the light-emitting structure, the second electrode having at least two projections extending in a second direction opposite the first direction along the horizontal axis, a portion of the projection of the first electrode disposed between and spaced apart from respective portions of the two projections of the second electrode;

wherein at least one of said projection of said first electrode and said projections of said second electrode are tapered in a direction toward one another.

2. The light-emitting diode of claim 1, further comprising:

a thin metal layer disposed above the light-emitting structure along the vertical axis and in contact with the light-emitting structure, the first electrode extending through the thin metal layer along the vertical axis to contact the first cladding layer, the first electrode defining a first elevation along the vertical axis.

3. The light-emitting diode of claim 1, wherein the second electrode is in contact with a surface of the second cladding layer in a well formed to expose the surface, the second electrode defining a second elevation lower than the first elevation along the vertical axis.

4. A light-emitting diode, comprising:

a substrate;

a light-emitting structure disposed above the substrate along a vertical axis, the light-emitting structure including a first cladding layer and a second cladding layer;

a first electrode a contact with the first cladding layer of the light-emitting structure, the first electrode having a projection extending in a first direction along a horizontal axis perpendicular to the vertical axis; and a second electrode in contact with the second cladding layer of the light-emitting structure, the second electrode having a least two projections extending in a second direction opposite the first direction along the horizontal axis, a portion of the projection of the first electrode disposed between and spaced apart from respective portions of the two projections of the second electrode;

wherein the projection of the first electrode is tapered in the first direction.

5. A light-emitting diode comprising:

a substrate;

a light-emitting structure disposed above the substrate along a vertical axis, the light-emitting structure including a first cladding layer and a second cladding layer;

a first electrode in contact with the first cladding layer of the light-emitting structure, the first electrode having a projection extending in a first direction along a horizontal axis perpendicular to the vertical axis; and a second electrode in contact with the second cladding layer of the light-emitting structure, the second electrode having at least two projections extending in a second direction opposite the first direction along the horizontal axis, a portion of the projection of the first electrode disposed between and spaced apart from respective portions of the two projections of the second electrode;

wherein the portions of the projections of the second electrode are tapered in the second direction.

6. The light-emitting diode of claim 1, wherein the first electrode includes an additional projection extending in the first direction, and the second electrode includes a third projection extending in the second direction, and the two projections of the first electrode are disposed between the three projections of the second electrode.

7. A light-emitting diode comprising:

a substrate;

a light-emitting structure disposed above the substrate along a vertical axis, the light-emitting structure including a first cladding layer and a second cladding layer;

a first electrode in contact with the first cladding layer of the light-emitting structure, the first electrode having a projection extending in a first direction along a horizontal axis perpendicular to the vertical axis; and a second electrode in contact with the second cladding layer of the light-emitting structure, the second electrode having at least two projections extending in a second direction opposite the first direction along the horizontal axis, a portion of the projection of the first electrode disposed between and spaced apart from respective portions of the two projections of the second electrode;

wherein the first electrode includes an additional projection extending in the first direction, and the second electrode includes a third projection extending in the second direction, and the two projections of the first electrode are disposed between the three projections of the second electrode;

wherein the projections of the first electrode and the second electrode are tapered.

8. The light-emitting diode of claim 1, further comprising a reflective layer disposed below the substrate and in connection with a bottom side of the substrate.

9. The light-emitting diode of claim 6, wherein the projections of the first electrode and the projections of the second electrode define a region capable of passing light.

10. The light-emitting diode of claim 9, wherein the region is substantially in an M shape.

11. The light-emitting diode of claim 9, wherein the region has a plurality of channels disposed therein, the channels further dividing the region into sub-regions.

12. The light emitting diode of claim 11, wherein the sub-regions are substantially in rectangular shapes.

13. The light-emitting diode of claim 11, wherein at least one of the channels has a vertical wall.

14. The light-emitting diode of claim 11, wherein at least one of the channels has an angled wall.

15. A light-emitting diode comprising:

a substrate;

a reflective layer disposed below the substrate and in connection with a bottom side of the substrate;

a light-emitting structure disposed above the substrate along a vertical axis, the light-emitting structure including a first cladding layer and a second cladding layer;

a thin metal layer disposed above the light-emitting structure along the vertical axis and in contact with the light-emitting structure;

a first electrode disposed above the light-emitting structure along the vertical axis, extending through the thin metal layer along the vertical axis, and in contact with the first cladding layer of the light-emitting structure, the first electrode having a plurality of projections extending in a first direction along a horizontal axis perpendicular to the vertical axis, the projections being tapered in the first direction; and a second electrode disposed above an exposed surface of the second cladding layer along the vertical axis and in contact with the exposed surface, the second electrode having a plurality of projections extending in a second direction opposite the first direction along the horizontal axis, the projections of the second electrode being tapered in the second direction, the projections of the first electrode interspersed with and spaced apart from the projections of the second electrode.

16. The light-emitting diode of claim 15, wherein the first cladding layer is a P cladding layer and the second cladding layer is an N cladding layer, and the first electrode is a P electrode and the second electrode is an N electrode.

17. The light-emitting diode of claim 15, wherein the first cladding layer is an N cladding layer and the second cladding layer is a P cladding layer, and the first electrode is an N electrode and the second electrode is a P electrode.

18. The light-emitting diode of claim 15, wherein the first electrode defines a first elevation, and the second electrode is disposed in a well, the second electrode defining a second elevation lower than the first elevation along the vertical axis.

19. The light-emitting diode of claim 15, wherein the projections of the first and second electrodes are straight.

20. The light-emitting diode of claim 15, wherein the projections of the first electrode have enlarged portions at respective ends of the projections.

21. The light-emitting diode of claim 20, wherein the enlarged portions have substantially circular shapes.

22. The light-emitting diode of claim 20, wherein at least one of the projections of the first electrode further comprises a minor extension extending from the respective enlarged portion.

23. The light-emitting diode of claim 15, wherein the projections of the second electrode have enlarged portions at respective ends of the projections.

24. The light-emitting diode of claim 23 wherein the enlarged portions have substantially circular shapes.

25. The light-emitting diode of claim 23, wherein at least one of the projections of the second electrode further comprises a minor extension extending from the enlarged portion.

26. The light-emitting diode of claim 15, wherein the projections of the first electrode and the projections of the second electrode define a surface region capable of passing light.

27. The light-emitting diode of claim 26, wherein the surface region has a M shape.

28. The light-emitting diode of claim 26, wherein the region has a plurality of channels disposed therein, the channels further dividing the region into sub-regions.

29. A light-emitting diode comprising:

a substrate;

a light-emitting structure disposed above the substrate along a vertical axis, the light-emitting structure including a first cladding layer and a second cladding layer;

a thin metal layer disposed above the light-emitting structure along the vertical axis and in contact with the light-emitting structure;

a first electrode disposed above the light-emitting structure along the vertical axis, extending through the thin metal layer along the vertical axis, and in contact with the first cladding layer of the light-emitting structure, the first electrode having a plurality of projections extending in a first direction along a horizontal axis perpendicular to the vertical axis, at least one projection having an enlarged portion at its end; and a second electrode disposed above an exposed surface of the second cladding layer along the vertical axis and in contact with the exposed surface, the second electrode having a plurality of projections extending in a second direction opposite the first direction along the horizontal axis, the projections of the first electrode interspersed with and spaced apart from the projections of the second electrode to define a region capable of passing light.

30. The light-emitting diode of claim 29, wherein the first cladding layer is a P cladding layer and the second cladding layer is an N cladding layer, and the first electrode is a P electrode and the second electrode is an N electrode.

31. The light-emitting diode of claim 29, wherein the first cladding layer is an N cladding layer and the second cladding layer is a P cladding layer, and the first electrode is an N electrode and the second electrode is a P electrode.

32. The light-emitting diode of claim 29, wherein each of the projections of the first electrode is spaced apart from a respective neighboring projection of the second electrode in substantially equal distance along the horizontal axis.

33. The light-emitting diode of claim 29, wherein at least one of the projections of the first electrode is tapered in the first direction.

34. The light-emitting diode of claim 29, wherein at least one of the projections of the second electrode is tapered in the second direction.

35. The light-emitting diode of claim 29, wherein the enlarged portion has a substantially circular shape.

36. The light-emitting diode of claim 29, wherein the enlarged portion has a minor extension extending therefrom.

37. A light-emitting diode comprising:

a substrate;

a reflective layer disposed below the substrate and in connection with a bottom side of the substrate;

a light-emitting structure disposed above the substrate along a vertical axis, the light-emitting structure including a P cladding layer and an N cladding layer, the P cladding layer disposed above the N cladding layer along the vertical axis;

a thin metal layer disposed above the P cladding layer of the light-emitting structure along the vertical axis and in contact with the P cladding layer;

a P electrode disposed above the P cladding layer of the light-emitting structure along the vertical axis to define a first elevation, extending through the thin metal layer along the vertical axis, and in contact with the P cladding layer, the P electrode having a plurality of projections extending in a first direction along a horizontal axis perpendicular to the vertical axis, the projections being tapered in the first direction and having enlarged regions at respective ends of the projections; and an N electrode disposed above the N cladding layer of the light-emitting structure along the vertical axis, the N electrode in contact with a surface of the N cladding layer in a well formed to expose the surface, the N electrode defining a second elevation offset from the first elevation along the vertical axis, the N electrode having a plurality of projections extending in a second direction opposite the first direction along the horizontal axis, the projections of the N electrode being tapered in the second direction and having enlarged regions at respective ends of the projections, the projections of the P electrode interspersed with and spaced apart from the projections of the N electrode.

38. The light-emitting diode of claim 37, wherein the second elevation is lower than the first elevation.

39. The light-emitting diode of claim 37, wherein the projection of the first electrode and the projections of the second electrode define a surface region capable of passing light.

40. The light-emitting diode of claim 39, wherein the surface region is substantially in a M shape.

41. The light-emitting diode of claim 39, wherein the surface region has a plurality of channels disposed therein, the channels further dividing the surface region into sub-regions.

42. The light-emitting diode of claim 41, wherein the sub-regions are substantially in rectangular shapes.

43. The plurality of light emitting diodes as disclosed in claim 1, wherein each of said plurality of light emitting diodes is positioned proximate to at least another one of said plurality of light emitting diodes and in a predetermined pattern.

44. The plurality of light emitting diodes as disclosed in claim 15, wherein each of said plurality of light emitting diodes is positioned proximate to at least another one of said plurality of light emitting diodes and ii a predetermined pattern.

45. The plurality of light emitting diodes as disclosed in claim 37, wherein each of said plurality of light emitting diodes is positioned in proximate to at least another one of said plurality of light emitting diodes and in a predetermined pattern.

* * * * *